United States Patent
Wang et al.

(10) Patent No.: US 11,231,629 B2
(45) Date of Patent: Jan. 25, 2022

(54) ARRAY SUBSTRATE AND METHOD FOR MANUFACTURING THE SAME, DISPLAY PANEL, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yan Wang, Beijing (CN); Wei Li, Beijing (CN); Yanqing Chen, Beijing (CN); Pan Guo, Beijing (CN); Ning Wang, Beijing (CN); Weida Qin, Beijing (CN); Jing Li, Beijing (CN); Wei Wei, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/954,006

(22) PCT Filed: Jan. 9, 2020

(86) PCT No.: PCT/CN2020/071061
§ 371 (c)(1),
(2) Date: Jun. 15, 2020

(87) PCT Pub. No.: WO2020/168852
PCT Pub. Date: Aug. 27, 2020

(65) Prior Publication Data
US 2021/0215981 A1 Jul. 15, 2021

(30) Foreign Application Priority Data
Feb. 22, 2019 (CN) .......................... 201910133809.4

(51) Int. Cl.
*G02F 1/1362* (2006.01)
*G02F 1/1333* (2006.01)
(Continued)

(52) U.S. Cl.
CPC ...... *G02F 1/136227* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

2014/0285744 A1 9/2014 Son et al.
2015/0185565 A1 7/2015 Park et al.
(Continued)

FOREIGN PATENT DOCUMENTS

CN 104076559 A 10/2014
CN 104749839 A 7/2015
(Continued)

OTHER PUBLICATIONS

International Search Report and Written Opinion for Application No. PCT/CN2020/071061, dated Apr. 10, 2020, 11 Pages.

*Primary Examiner* — Ryan Crockett
(74) *Attorney, Agent, or Firm* — Brooks Kushman P.C.

(57) ABSTRACT

Disclosed are an array substrate and a method for manufacturing the same, a display panel, and a display device. The array substrate includes: a base substrate; a TFT array layer provided on the base substrate, wherein the TFT array layer includes a plurality of driver transistors arranged in an array; a color resist layer provided on a side of the TFT array layer distal to the base substrate, wherein the color resist layer includes a plurality of color resist patterns independent from each other, a first opening is formed between adjacent ones
(Continued)

of the color resist patterns, and an orthogonal projection of the first opening onto the base substrate at least partially overlaps with an orthogonal projection of an output electrode in a respective one of the driver transistors onto the base substrate; and pixel electrodes provided on a side of the color resist layer distal to the base substrate.

20 Claims, 2 Drawing Sheets

(51) Int. Cl.
    *G02F 1/1335*     (2006.01)
    *G02F 1/1343*     (2006.01)
    *G02F 1/1368*     (2006.01)
    *H01L 27/12*     (2006.01)

(52) U.S. Cl.
    CPC .. *G02F 1/133345* (2013.01); *G02F 1/133357* (2021.01); *G02F 1/133512* (2013.01); *G02F 1/136222* (2021.01); *H01L 27/1248* (2013.01); *H01L 27/1259* (2013.01)

(56) References Cited

U.S. PATENT DOCUMENTS

| | | | |
|---|---|---|---|
| 2016/0116797 A1 | 4/2016 | Itou et al. | |
| 2016/0178963 A1* | 6/2016 | Itou | G02F 1/133514 257/72 |
| 2017/0287944 A1* | 10/2017 | Jiang | H01L 27/124 |
| 2018/0314118 A1* | 11/2018 | Itou | G02F 1/13439 |

FOREIGN PATENT DOCUMENTS

| | | |
|---|---|---|
| CN | 109634014 A | 4/2019 |
| JP | 2016114884 A | 6/2016 |
| JP | 2016191891 A | 11/2016 |
| JP | 2017116821 A | 6/2017 |

* cited by examiner

--Prior Art--

ARRAY SUBSTRATE AND METHOD FOR MANUFACTURING THE SAME, DISPLAY PANEL, AND DISPLAY DEVICE

CROSS-REFERENCE TO RELATED APPLICATIONS

This application is the U.S. national phase of PCT Application No. PCT/CN2020/071061 filed on Jan. 9, 2020, which claims priority to Chinese Patent Application No. 201910133809.4 filed on Feb. 22, 2019, which are incorporated herein by reference in their entireties.

TECHNICAL FIELD

The present disclosure relates to the field of display technologies, in particular, to an array substrate and a method for manufacturing the same, a display panel, and a display device.

BACKGROUND

With the unceasing development of display technologies, flexible liquid crystal display devices attract wide attention due to their advantages of low cost and strong material adaptability, etc. A flexible liquid crystal display device generally includes an array substrate and a color filter substrate provided opposite to each other, and a liquid crystal layer provide therebetween, wherein the pixel electrodes on the array substrate correspond to the color resist patterns on the color filter substrate respectively, and each of the pixel electrodes drives a corresponding subpixel, so that the subpixel emits light with a color of the color resist pattern corresponding to the pixel electrode.

However, due to a misalignment between the array substrate and the color filter substrate when the flexible liquid crystal display device is bent, the matching of the pixel electrodes and the corresponding color resist patterns is unbalanced. As a result, when the pixel electrode drives the corresponding subpixel, an adjacent subpixel will also be driven, resulting in color mixing.

SUMMARY

In a first aspect, the present disclosure provides an array substrate, which includes: a base substrate; a Thin Film Transistor (TFT) array layer provided on the base substrate, wherein the TFT array layer includes a plurality of driver transistors arranged in an array; a color resist layer provided on a side of the TFT array layer distal to the base substrate, wherein the color resist layer includes a plurality of color resist patterns independent from each other, a first opening is formed between adjacent ones of the color resist patterns, and an orthogonal projection of the first opening onto the base substrate at least partially overlaps with an orthogonal projection of an output electrode in a respective one of the driver transistors onto the base substrate; and pixel electrodes provided on a side of the color resist layer distal to the base substrate, wherein the pixel electrodes correspond to the driver transistors respectively, and the pixel electrode is connected to the output electrode in the corresponding driver transistor via the first opening.

Optionally, the array substrate further includes: a planarization layer provided between the pixel electrodes and the color resist layer, wherein the planarization layer is provided with a plurality of first via holes corresponding to the plurality of driver transistors respectively, an orthogonal projection of the first via hole onto the base substrate is located within the orthogonal projection of the first opening onto the base substrate, and the orthogonal projection of the first via hole on the base substrate at least partially overlaps with the orthogonal projection of the output electrode in the driver transistor corresponding to the first via hole onto the base substrate; and the pixel electrode is connected to the output electrode in the corresponding driver transistor through the corresponding first via hole and the corresponding first opening.

Optionally, an orthogonal projection of the planarization layer on the base substrate covers an orthogonal projection of each of the color resist patterns on the base substrate.

Optionally, a distance between a boundary of the orthogonal projection of the planarization layer on the base substrate and a boundary of the orthogonal projection of the corresponding color resist pattern onto the base substrate is determined according to a dimensional precision of the array substrate to be manufactured.

Optionally, the array substrate further includes: a common electrode layer provided between the planarization layer and the pixel electrodes, wherein the common electrode layer is provided with a second opening, and an orthogonal projection of the second opening onto the base substrate covers the orthogonal projection of the respective first via hole onto the base substrate; and a first passivation layer provided between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate; the pixel electrode is connected to the output electrode in the corresponding driver transistor through the corresponding second via hole, the corresponding second opening, the corresponding first via hole and the corresponding first opening.

In a second aspect, based on the technical solutions of the above array substrate, the present disclosure provides a display panel, which includes the above array substrate, wherein the display panel further includes: an opposite substrate provided opposite to the array substrate, wherein the opposite substrate is provided with a black matrix pattern, an orthogonal projection of the black matrix pattern onto the base substrate of the array substrate covers an orthogonal projection of the first opening, which is formed between the adjacent color resist patterns in the array substrate, onto the base substrate; and a liquid crystal layer provided between the array substrate and the opposite substrate.

Optionally, an orthogonal projection of the black matrix pattern on the base substrate partially overlaps with an orthogonal projection of each of the color resist patterns, which are located on a periphery of the first opening, on the base substrate.

Optionally, a size of an overlapped part between an orthogonal projection of the black matrix pattern on the base substrate and an orthogonal projection of each of the color resist patterns, which are located on a periphery of the first opening, on the base substrate is determined according to a dimensional precision of the array substrate to be manufactured and a precision of alignment between the array substrate and the opposite substrate.

In a third aspect, based on the technical solutions of the above display panel, the present disclosure provides a display device, which includes the above display panel.

In a fourth aspect, based on the technical solutions of the above array substrate, the present disclosure provides a method for forming an array substrate, which includes: providing a base substrate; forming a TFT array layer on the base substrate, wherein the TFT array layer includes a plurality of driver transistors arranged in an array; forming a color resist layer on a side of the TFT array layer distal to the base substrate, wherein the color resist layer includes a plurality of color resist patterns independent from each other, a first opening is formed between adjacent ones of the color resist patterns, and an orthogonal projection of the first opening onto the base substrate at least partially overlaps with an orthogonal projection of an output electrode in each of the driver transistors onto the base substrate; and forming pixel electrodes on a side of the color resist layer distal to the base substrate, wherein the pixel electrodes correspond to the driver transistors respectively, and the pixel electrode is connected to the output electrode in the corresponding driver transistor via the first opening.

Optionally, the method further includes: forming a planarization layer between the pixel electrodes and the color resist layer, wherein the planarization layer is provided with a plurality of first via holes corresponding to the plurality of driver transistors respectively, an orthogonal projection of the first via hole onto the base substrate is located within the orthogonal projection of the first opening onto the base substrate, and the orthogonal projection of the first via hole on the base substrate at least partially overlaps with the orthogonal projection of the output electrode in the driver transistor corresponding to the first via hole onto the base substrate; and the pixel electrode is connected to the output electrode in the corresponding driver transistor through the corresponding first via hole and the corresponding first opening.

Optionally, the forming the planarization layer between the pixel electrodes and the color resist layer includes: configuring that an orthogonal projection of the planarization layer onto the base substrate covers an orthogonal projection of each of the color resist patterns onto the base substrate.

Optionally, the method further includes: forming a common electrode layer between the planarization layer and the pixel electrodes, wherein the common electrode layer is provided with a second opening, and an orthogonal projection of the second opening onto the base substrate covers the orthogonal projection of the respective first via hole onto the base substrate; and forming a first passivation layer between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate; the pixel electrode is connected to the output electrode in the corresponding driver transistor through the corresponding second via hole, the corresponding second opening, the corresponding first via hole and the corresponding first opening.

BRIEF DESCRIPTION OF THE DRAWINGS

The drawings illustrated herein are provided for further understanding the present disclosure and constituting a part of the present disclosure. The exemplary embodiments of the present disclosure and the illustrations thereof are used for explaining the present disclosure, rather than improperly limiting the present disclosure. In the drawings.

DETAILED DESCRIPTION

For further illustrating the array substrate and the method for manufacturing the same, the display panel and the display device according to the embodiments of the present disclosure, detailed description will be provided below in conjunction with the drawings.

Figure 1:
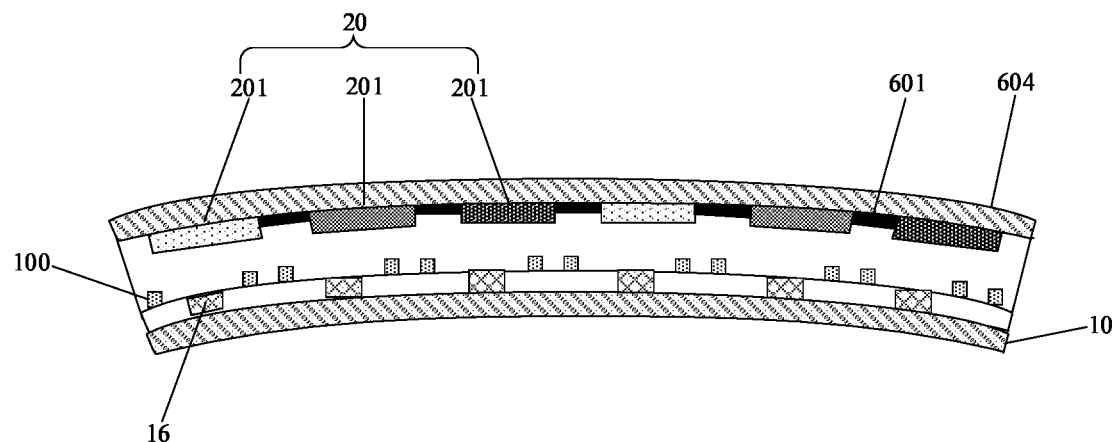
FIG. 1 is a schematic diagram showing a bended display panel in the related art.

As shown in FIG. 1, in the related art, the flexible liquid crystal display device generally includes an array substrate and a color filter substrate provided opposite to each other, when the flexible liquid crystal display device is bended, as shown in FIG. 1, a misalignment occurs between the pixel electrode 100 in the array substrate and the corresponding color resist pattern 201 in the color filter substrate, so that when the pixel electrode drives the corresponding subpixel, an adjacent subpixel will also be driven, resulting in color mixing of the flexible liquid crystal display device.

Figure 2:
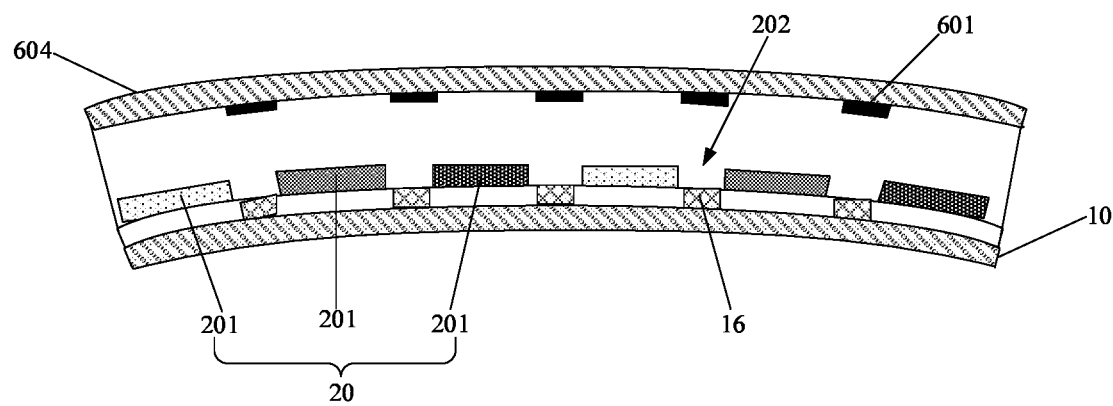
FIG. 2 is a schematic diagram showing a bended display panel according to an embodiment of the present disclosure.
Figure 3:
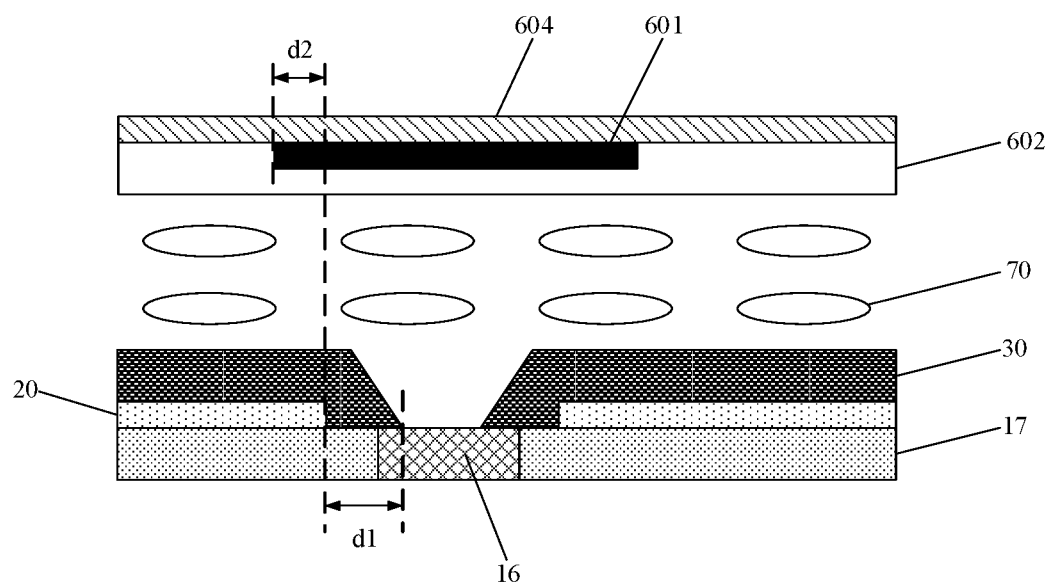
FIG. 3 is a first schematic diagram of a display panel according to an embodiment of the present disclosure.
Figure 4:
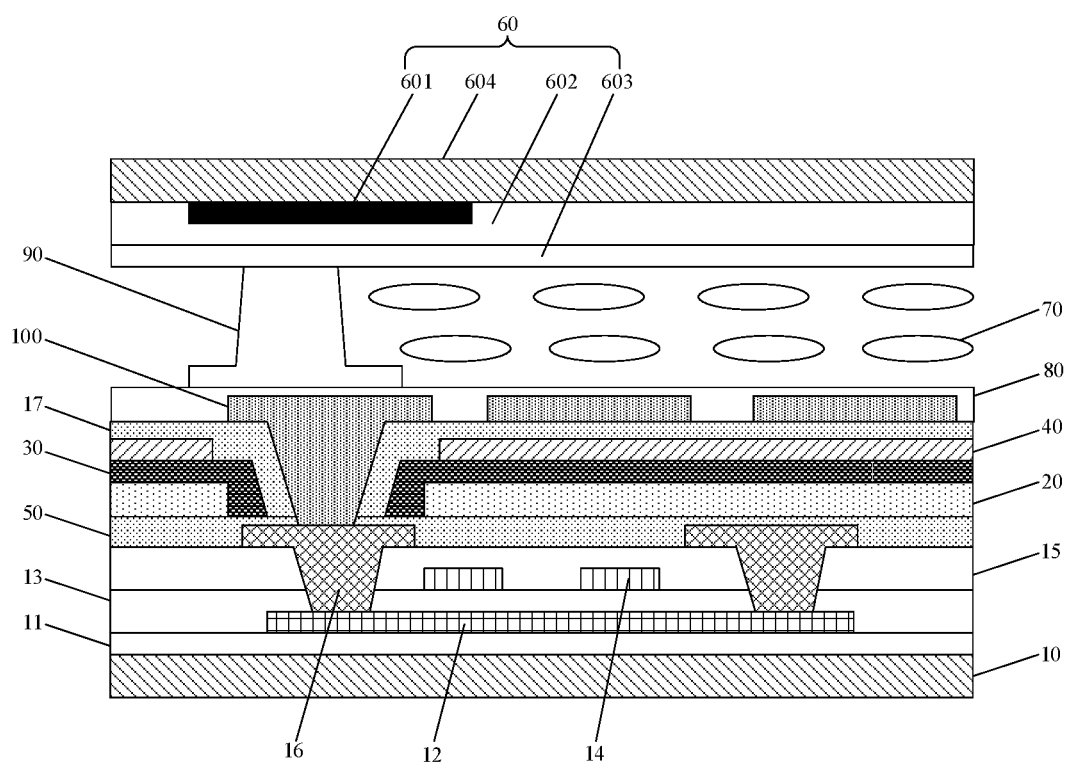
FIG. 4 is a second schematic diagram of a display panel according to an embodiment of the present disclosure.

As shown in FIGS. 2-4, an array substrate according to an embodiment of the present disclosure includes: a base substrate 10, a TFT array layer, a color resist layer 20 and a pixel electrode 100; wherein, the TFT array layer is provided on the base substrate 10, and the TFT array layer includes a plurality of driver transistors arranged in an array; the color resist layer 20 is provided on a side of the TFT array layer distal to the base substrate 10, and the color resist layer 20 includes a plurality of color resist patterns 201 independent from each other, a first opening 202 is formed between adjacent color resist patterns 201, the orthogonal projection of the first opening 202 onto the base substrate 10 at least partially overlaps with the orthogonal projection of the output electrode 16 of the respective driver transistor onto the base substrate 10; the pixel electrode 100 is provided on a side of the color resist layer 20 distal to the base substrate 10, the pixel electrodes 100 correspond to the driver transistors respectively, and the pixel electrode 100 is connected to the output electrode 16 in the corresponding driver transistor through the first opening 202. It should be noted that, the above driver transistor specifically includes: an active layer 12, a gate insulation layer 13, a gate layer 14, a dielectric layer 15 and an output electrode 16, etc., and the above array substrate further includes: a light shielding layer 11, a second passivation layer 50 and a first alignment layer 80, etc.

Specifically, a process for manufacturing the above array substrate includes: firstly, a TFT array layer is formed on the base substrate 10, then, a color resist layer 20 is formed on the TFT array layer, and the color resist layer 20 includes a plurality of color resist patterns 201 independent from each other, a first opening 202 is formed between adjacent color resist patterns 201, and the orthogonal projection of the first opening 202 onto the base substrate 10 at least partially overlaps with the orthogonal projection of the output electrode 16 of the respective driver transistor in the TFT array layer onto the base substrate 10; then, a pixel electrode 100 is formed, and the pixel electrode 100 may be connected to the output electrode 16 in the corresponding driver transistor through the first opening 202 formed by the color resist pattern 201.

When a liquid crystal display panel is manufactured using the above array substrate, the above array substrate and an opposite substrate 60 without a color resist layer 20 may be oppositely arranged to form a cell, and then a liquid crystal layer 70 is formed in the cell.

It may be known from the specific structure and application mode of the above array substrate that, in the array substrate according to the embodiment of the present disclosure, a color resist layer 20 is provided between the TFT array layer and the pixel electrode 100, thus when a display panel is formed by using the array substrate according to the embodiment of the present disclosure, no color resist layer needs to be provided in the opposite substrate 60. Therefore, when the array substrate and the opposite substrate 60 are oppositely arranged to form a cell, it does not need to consider the issue of precise alignment between the pixel electrode 100 in the array substrate and the color resist layer in the opposite substrate 60, so that the difficulty of the cell alignment during the process of manufacturing the display panel may be greatly reduced, thereby avoiding the error during the cell alignment. Moreover, because the pixel electrode 100 and the color resist layer 20 are both formed on the array substrate, when a display device including the array substrate is bended, no misalignment will occur between the pixel electrode 100 and the corresponding color resist pattern 201, so that color mixing during the displaying of the display device in a bended state can be well avoided. Therefore, the array substrate according to the embodiment of the present disclosure may be applied to a curved display device.

Additionally, in the array substrate according to the embodiment of the present disclosure, the color resist layer 20 is provided to include a plurality of color resist patterns 201 independent from each other, so that each color resist pattern 201 is of an island structure, and at the same time, a first opening 202 is formed between adjacent color resist patterns 201, and the orthogonal projection of the first opening 202 onto the base substrate 10 at least partially overlaps with the orthogonal projection of the output electrode 16 of the respective driver transistor onto the base substrate 10, thus when a pixel electrode 100 is formed on the color resist layer 20, the pixel electrode 100 may be connected to the output electrode 16 of the corresponding driver transistor directly through the first opening 202 formed by the color resist pattern 201, without the need to forming a hole in the color resist layer 20 to realize the connection between the pixel electrode 100 and the output electrode 16 of the driver transistor. Therefore, in the array substrate according to the embodiment of the present disclosure, the pixel electrode 100 and the output electrode 16 of the corresponding driver transistor respectively located on the two sides of the color resist layer 20 may be connected without the need to forming a hole in the color resist layer 20, thus a following problem may be well avoided: the size of the array substrate may fluctuate largely when a hole is formed in the color resist layer 20 due to the fact that difficulty level in forming the hole in the color resist layer 20, and the formed via hole cannot realize the normal connection between the pixel electrode 100 and the output electrode 16 in the corresponding driver transistor.

In some embodiments, the array substrate according to the above embodiment further includes: a planarization layer 30 provided between the pixel electrode 100 and the color resist layer 20, wherein the planarization layer 30 is provided with a plurality of first via holes corresponding to the plurality of driver transistors respectively, the orthogonal projection of the first via hole onto the base substrate 10 is located within the orthogonal projection of the first opening 202 onto the base substrate 10, and the orthogonal projection of the first via hole onto the base substrate 10 at least partially overlaps with the orthogonal projection of the output electrode 16 in the driver transistor corresponding to the first via hole onto the base substrate 10; and the pixel electrode 100 is connected to the output electrode 16 in the corresponding driver transistor through the corresponding first via hole and the corresponding first opening 202.

Specifically, after forming the color resist layer 20, a planarization layer 30 may be formed on the color resist layer 20, and the process for forming the planarization layer 30 includes: firstly, a planarization layer thin film is formed, and then the planarization layer thin film is patterned to form the planarization layer 30 including the plurality of first via holes.

In the array substrate according to the above embodiment, the planarization layer 30 is formed on a side of the color resist layer 20 distal to the base substrate 10, so that the surface for subsequently forming the pixel electrode 100 is more flat, which is more favorable for improving the manufacture precision of the pixel electrode 100. Moreover, the orthogonal projection of the first via hole, which is defined on the planarization layer 30, onto the base substrate 10 is located within the orthogonal projection of the first opening 202 onto the base substrate 10, and the first via hole overlaps with the output electrode 16 of the corresponding driver transistor in the direction vertical to the base substrate 10, so that the pixel electrode 100 may be in good connection with the output electrode 16 of the corresponding driver transistor through the corresponding first via hole and the corresponding first opening 202, thereby ensuring a good driving effect of the driver transistor on the pixel electrode 100.

Further, the orthogonal projection of the planarization layer 30 according to the above embodiment on the base substrate 10 may be provided to cover the orthogonal projection of each color resist pattern 201 onto the base substrate 10.

Specifically, the orthogonal projection of the planarization layer 30 onto the base substrate 10 is provided to cover the orthogonal projection of each color resist pattern 201 onto the base substrate 10, that is, the planarization layer 30 is provided to fully cover each color resist pattern 201 (including the lateral surface of each color resist pattern 201), so that the planarization layer 30 can completely isolate the color resist pattern 201 from another film layer subsequently formed on the planarization layer 30 and the pixel electrode 100, thereby better ensuring the performance of the array substrate.

It should be noted that, as shown in FIG. 3, the distance d1 between the boundary of the orthogonal projection of the planarization layer 30 onto the base substrate 10 and the boundary of the orthogonal projection of the corresponding color resist pattern 201 onto the base substrate 10 may be set as practically required, and the set value of the distance d1 may be determined by considering the dimensional precision of the array substrate to be manufactured. For example, the dimensional precision may be Critical Dimension (CD) precision.

In some embodiments, the array substrate according to the above embodiment further includes: a common electrode layer 40 provided between the planarization layer 30 and the pixel electrode 100, wherein the common electrode layer 40 is provided with a second opening, and the orthogonal projection of the second opening onto the base substrate 10 covers the orthogonal projection of the respective first via hole onto the base substrate 10; a first passivation layer 17 provided between the common electrode layer 40 and the pixel electrode 100, wherein the first passivation layer 17 is provided with a plurality of second via holes corresponding to the plurality of driver transistors respectively, the orthogonal projection of the second via hole onto the base substrate 10 is located within the orthogonal projection of the first via hole onto the base substrate 10, and the orthogonal projection of the second via hole onto the base substrate 10 at least partially overlaps with the orthogonal projection of the output electrode 16 of the driver transistor corresponding the second via hole onto the base substrate 10; the pixel electrode 100 is connected to the output electrode 16 in the corresponding driver transistor through the corresponding second via hole, the corresponding second opening, the corresponding first via hole and the corresponding first opening 202.

Specifically, after forming the planarization layer 30, a common electrode layer 40 may be formed on the planarization layer 30, wherein the specific shape of the common electrode layer 40 may be set as practically required, for example, a comb-shaped common electrode layer 40 may be provided; moreover, in order to ensure the connection between the pixel electrode 100 and the output electrode 16 in the corresponding driver transistor, a second opening may be provided on the common electrode layer 40, and the orthogonal projection of the second opening onto the base substrate 10 covers the orthogonal projection of the respective first via hole onto the base substrate 10. After forming the common electrode layer 40, a first passivation layer 17 is formed on the common electrode layer 40, and at the same time, a plurality of second via holes corresponding to the plurality of driver transistors respectively are provided on the first passivation layer 17. The orthogonal projection of the second via hole onto the base substrate 10 is defined to be within the orthogonal projection of the first via hole onto the base substrate 10, and the orthogonal projection of the second via hole onto the base substrate 10 is defined to at least partially overlap with the orthogonal projection of the output electrode 16 of the driver transistor corresponding the second via hole onto the base substrate 10, so that the pixel electrode 100 subsequently formed on the first passivation layer 17 can be connected to the output electrode 16 in the corresponding driver transistor through the corresponding second via hole, the second opening, the corresponding first via hole and the first opening 202.

The above array substrate is provided to include both a pixel electrode 100 and a common electrode layer 40, and when a display device including the array substrate is bended, no misalignment will occur between the common electrode layer 40 and the pixel electrode 100, thus it can be ensured that a uniform electric field can be generated between the common electrode layer 40 and the pixel electrode 100 when the display device is in a bended state, so that the display device can operate in a stable state.

As shown in FIG. 2-FIG. 4, an embodiment of the present disclosure further provides a display panel, which includes an array substrate according to the above embodiment, and the display panel further includes an opposite substrate 60 and a liquid crystal layer 70; wherein the opposite substrate 60 and the array substrate are provided opposite to each other, the opposite substrate 60 is provided with a black matrix pattern 601, and the orthogonal projection of the black matrix pattern 601 onto the base substrate 10 of the array substrate covers the orthogonal projection of the first opening 202, which is formed between adjacent color resist patterns 201 in the array substrate, onto the base substrate 10; and the liquid crystal layer 70 is provided between the array substrate and the opposite substrate 60. The above opposite substrate 60 further includes a protective layer 602, a second alignment layer 603 and a base 604, and the above display panel further includes a spacer 90 provided between the array substrate and the opposite substrate 60.

Specifically, during a process of manufacturing the above display panel, an array substrate according to the above embodiment and an opposite substrate 60 provided with a black matrix pattern 601 may be first provided, and then the array substrate and the opposite substrate 60 are oppositely arranged to form a cell, so that the black matrix pattern 601 on the opposite substrate 60 and each film layer on the array substrate may be provided opposite to each other, and the orthogonal projection of the black matrix pattern 601 on the opposite substrate 60 onto the base substrate 10 of the array substrate covers the orthogonal projection of the first opening 202, which is formed between adjacent color resist patterns 201 in the array substrate, onto the base substrate 10, thus the black matrix pattern 601 can shield the driver transistor overlapping with the first opening 202 in the direction vertical to the base substrate 10 in the array substrate. The liquid crystal layer 70 included in the above display panel may be formed after the array substrate and the opposite substrate 60 are oppositely arranged to form the cell, or, may be formed on a side of the pixel electrode 100 in the array substrate distal to the base substrate 10 before the array substrate and the opposite substrate 60 are oppositely arranged to form the cell.

Because the display panel according to the embodiment of the present disclosure includes the array substrate according to the above embodiment, when the above array substrate and the opposite substrate 60 are oppositely arranged to form the cell so as to form the display panel according to the embodiment of the present disclosure, no color resist layer needs to be provided in the opposite substrate 60, thus in the process in which the array substrate and the opposite substrate 60 are oppositely arranged to form the cell, it does not need to consider the issue of precise alignment between the pixel electrode 100 in the array substrate and the color resist layer in the opposite substrate 60, so that the difficulty of the cell alignment during the process of manufacturing the display panel may be greatly reduced, thereby avoiding the error during the cell alignment. Moreover, because in the display panel according to the embodiment of the present disclosure, the pixel electrode 100 and the color resist layer 20 are both formed on the array substrate, when the display device including the display panel according to the embodiment of the present disclosure is bended, no misalignment will occur between the pixel electrode 100 and the corresponding color resist pattern 201, so that the color mixing during the displaying of the display device in a bended state can be well avoided.

Additionally, in the display panel according to the embodiment of the present disclosure, the color resist layer 20 is provided on the array substrate, and the black matrix pattern 601 is provided on the opposite substrate 60, so that the following problem may be avoided while the shielding function of the black matrix pattern 601 is implemented: the black matrix pattern 601 affects the identification of the alignment mark in the array substrate when the black matrix pattern 601 is provided on the array substrate.

Further, the orthogonal projection of the above black matrix pattern 601 onto the base substrate 10 may be set to partially overlap with the orthogonal projection of each color resist pattern 201, which is located at the periphery of the first opening 202, onto the base substrate 10.

Specifically, the orthogonal projection of the black matrix pattern 601 onto the base substrate 10 partially overlaps with the orthogonal projection of each color resist pattern 201, which is located at the periphery of the first opening 202, onto the base substrate 10, so that the black matrix pattern 601 can partially shield each color resist pattern 201 located at the periphery of the first opening 202 in the direction vertical to the base substrate 10 of the array substrate, thus even if the display panel is in a bended state, the black matrix pattern 601 still can well shield the driver transistor located on the array substrate, so that the display effect of the display panel can be better ensured.

It should be noted that, as shown in FIG. 3, the size d2 of the overlapped part between the orthogonal projection of the black matrix pattern 601 onto the base substrate 10 and the orthogonal projection of each color resist pattern 201, which is located at the periphery of the first opening 202, onto the base substrate 10 may be set as required, and the set value of the size d2 may be determined by considering the dimensional precision of the array substrate to be manufactured and the precision of alignment between the array substrate and the opposite substrate 60.

An embodiment of the present disclosure further provides a display device, which includes the display panel according to the above embodiment.

In some embodiments of the present disclosure, the display device may be a curved display device.

Because the display device according to the embodiment of the present disclosure includes the display panel according to the above embodiment, in the process of manufacturing the display device according to the embodiment of the present disclosure, there also exist the beneficial effects of reducing the difficulty of the cell alignment process and avoiding the error during cell alignment. Moreover, when the display device according to the embodiment of the present disclosure is bended, no misalignment will occur between the pixel electrode 100 and the corresponding color resist pattern 201, so that color mixing during the displaying of the display device in a bended state can be well avoided.

Additionally, by the display device according to the embodiment of the present disclosure, the following problem may be avoided while the shielding function of the black matrix pattern 601 is implemented: the black matrix pattern 601 affects the identification of the alignment mark in the array substrate when the black matrix pattern 601 is provided on the array substrate.

An embodiment of the present disclosure further provides a method for forming an array substrate, which includes that: a base substrate 10 is provided; a TFT array layer is formed on the base substrate 10, wherein the TFT array layer includes a plurality of driver transistors arranged in an array; a color resist layer 20 is formed on a side of the TFT array layer distal to the base substrate 10, wherein the color resist layer 20 includes a plurality of color resist patterns 201 independent from each other, a first opening 202 is formed between adjacent color resist patterns 201, and the orthogonal projection of the first opening 202 onto the base substrate 10 at least partially overlaps with the orthogonal projection of the output electrode 16 of each driver transistor onto the base substrate 10; and pixel electrodes 100 are formed on a side of the color resist layer 20 distal to the base substrate 10, wherein the pixel electrodes 100 correspond to the driver transistors respectively, and the pixel electrode 100 is connected to the output electrode 16 in the corresponding driver transistor through the first opening 202.

Specifically, a process for forming the above array substrate includes: firstly, a TFT array layer is formed on the base substrate 10; then, a resist layer 20 is formed on the TFT array layer. For example, the color resist layer 20 includes a red color resist pattern, a green color resist pattern and a blue color resist pattern, the red color resist thin film may be first formed on a side of the TFT array layer distal to the base substrate 10, then the red color resist thin film is patterned to form a plurality of red color resist patterns independent from each other, and next, the green color resist thin film is formed on a side of the red color resist pattern distal to the base substrate 10, and the green color resist thin film is patterned to form a plurality of green color resist patterns independent from each other, and finally, the blue color resist thin film is formed on a side of the red color resist pattern and the green color resist pattern distal to the base substrate 10, and the blue color resist thin film is patterned to form a plurality of blue color resist patterns independent from each other; the formed color resist patterns 201 of various colors are all provided in the form of an island. A first opening 202 is formed between adjacent color resist patterns 201, and the orthogonal projection of the first opening 202 onto the base substrate 10 at least partially overlaps with the orthogonal projection of the output electrode 16 of each driver transistor in the TFT array layer onto the base substrate 10. After the color resist layer 20 is formed, a pixel electrode 100 is formed, and the pixel electrode 100 may be connected to the output electrode 16 in the corresponding driver transistor through the first opening 202 formed by the color resist pattern 201.

It should be noted that, the above steps of forming the TFT array layer and the pixel electrode 100 may both be realized by employing the measures in the related art, which will not be illustrated herein.

In the array substrate manufactured by the method according to the embodiment of the present disclosure, a color resist layer 20 is provided between the TFT array layer and the pixel electrode 100, thus when a display panel is formed by the array substrate manufactured according to the manufacturing method of the embodiment of the present disclosure, no color resist layer needs to be provided in the opposite substrate 60. Therefore, when the array substrate and the opposite substrate 60 are oppositely arranged to form a cell, it does not need to consider the issue of precise alignment between the pixel electrode 100 in the array substrate and the color resist layer in the opposite substrate 60, so that the difficulty of the cell alignment during the process of manufacturing the display panel may be greatly reduced, thereby avoiding the error during the cell alignment. Moreover, because the pixel electrode 100 and the color resist layer 20 are both formed on the array substrate, when a display device including the array substrate is bended, no misalignment will occur between the pixel electrode 100 and the corresponding color resist pattern 201, so that color mixing during the displaying of the display device in a bended state can be well avoided.

Additionally, in the array substrate manufactured by the method according to the embodiment of the present disclosure, the color resist layer 20 is provided to include a plurality of color resist patterns 201 independent from each other, so that each color resist pattern 201 has an island structure, and at the same time, a first opening 202 is formed between adjacent color resist patterns 201, and the orthogonal projection of the first opening 202 onto the base substrate 10 at least partially overlaps with the orthogonal projection of the output electrode 16 in each driver transistor onto the base substrate 10, thus when a pixel electrode 100 is formed on the color resist layer 20, the pixel electrode 100 may be connected to the output electrode 16 of the corresponding driver transistor directly through the first opening 202 formed by the color resist pattern 201, without the need to forming a hole in the color resist layer 20 to realize the connection between the pixel electrode 100 and the output electrode 16 of the driver transistor. Therefore, in the array substrate manufactured by the method according to the embodiment of the present disclosure, the pixel electrode 100 and the output electrode 16 of the corresponding driver transistor respectively located on the two sides of the color resist layer 20 may be connected without the need to forming a hole in the color resist layer 20, thus a following problem may be well avoided: the size of the array substrate may fluctuate largely when a hole is formed in the color resist layer 20 due to the fact that difficulty level in forming the hole in the color resist layer 20, and the formed via hole cannot realize the normal connection between the pixel electrode 100 and the output electrode 16 in the corresponding driver transistor.

In addition, the method for manufacturing the array substrate according to the above embodiment further includes: a planarization layer 30 is formed between the pixel electrode 100 and the color resist layer 20, wherein the planarization layer 30 is provided with a plurality of first via holes corresponding to the plurality of driver transistors respectively, the orthogonal projection of the first via hole onto the base substrate 10 is located within the orthogonal projection of the first opening 202 onto the base substrate 10, and the orthogonal projection of the first via hole onto the base substrate 10 at least partially overlaps with the orthogonal projection of the output electrode 16 in the driver transistor corresponding to the first via hole onto the base substrate 10; and the pixel electrode 100 is connected to the output electrode 16 in the corresponding driver transistor through the corresponding first via hole and the corresponding first opening 202.

Specifically, after forming the color resist layer 20, a planarization layer 30 may be formed on the color resist layer 20, and the process for forming the planarization layer 30 includes: firstly, a planarization layer thin film is formed, and then the planarization layer thin film is patterned to form the planarization layer 30 including the plurality of first via holes.

In the array substrate manufactured by the method according to the above embodiment, the planarization layer 30 is formed on a side of the color resist layer 20 distal to the base substrate 10, so that the surface for subsequently forming the pixel electrode 100 will be more flat, which is more favorable for improving the manufacture precision of the pixel electrode 100. Moreover, the orthogonal projection of the first via hole, which is defined on the planarization layer 30, onto the base substrate 10 is located within the orthogonal projection of the first opening 202 onto the base substrate 10, and the first via hole overlaps with the output electrode 16 of the corresponding driver transistor in the direction vertical to the base substrate 10, so that the pixel electrode 100 may be in good connection with the output electrode 16 of the corresponding driver transistor through the corresponding first via hole and the corresponding first opening 202, thereby ensuring a good driving effect of the driver transistor on the pixel electrode 100.

Further, when the planarization layer 30 is formed by the method according to the above embodiment, the orthogonal projection of the planarization layer 30 onto the base substrate 10 may be provided to cover the orthogonal projection of each color resist pattern 201 onto the base substrate 10.

Specifically, the orthogonal projection of the planarization layer 30 onto the base substrate 10 is configured to cover the orthogonal projection of each color resist pattern 201 onto the base substrate 10, that is, the planarization layer 30 is provided to fully cover each color resist pattern 201 (including the lateral surface of each color resist pattern 201), so that the planarization layer 30 can completely isolate the color resist pattern 201 from another film layer subsequently formed on the planarization layer 30 and the pixel electrode 100, thereby better ensuring the performance of the array substrate.

Further, the method for manufacturing the array substrate according to the above embodiment further includes that: a common electrode layer 40 is formed between the planarization layer 30 and the pixel electrode 100, wherein the common electrode layer 40 is provided with a second opening, and the orthogonal projection of the second opening onto the base substrate 10 covers the orthogonal projection of the respective first via hole onto the base substrate 10; and a first passivation layer 17 is formed between the common electrode layer 40 and the pixel electrode 100, wherein the first passivation layer 17 is formed with a plurality of second via holes corresponding to the plurality of driver transistors respectively, the orthogonal projection of the second via hole onto the base substrate 10 is located within the orthogonal projection of the first via hole onto the base substrate 10, and the orthogonal projection of the second via hole onto the base substrate 10 at least partially overlaps with the orthogonal projection of the output electrode 16 of the driver transistor corresponding the second via hole onto the base substrate 10; the pixel electrode 100 is connected to the output electrode 16 in the corresponding driver transistor through the corresponding second via hole, the corresponding second opening, the corresponding first via hole and the corresponding first opening 202.

Specifically, after forming the planarization layer 30, a common electrode layer 40 may be formed on the planarization layer 30, and the specific shape of the common electrode layer 40 may be formed as practically required, for example, a comb-shaped common electrode layer 40 may be formed. Moreover, in order to ensure the connection between the pixel electrode 100 and the output electrode 16 in the corresponding driver transistor, a second opening may be provided on the common electrode layer 40, and the orthogonal projection of the second opening onto the base substrate 10 covers the orthogonal projection of the respective first via hole onto the base substrate 10. After forming the common electrode layer 40, a first passivation layer 17 is formed on the common electrode layer 40, and at the same time, a plurality of second via holes corresponding to the plurality of driver transistors respectively are provided on the first passivation layer 17. The orthogonal projection of the second via hole onto the base substrate 10 is defined to be within the orthogonal projection of the first via hole onto the base substrate 10, and the orthogonal projection of the second via hole onto the base substrate 10 is defined to at least partially overlap with the orthogonal projection of the output electrode 16 of the driver transistor corresponding the second via hole onto the base substrate 10, so that the pixel electrode 100 subsequently formed on the first passivation layer 17 can be connected to the output electrode 16 in the corresponding driver transistor through the corresponding second via hole, the second opening, the corresponding first via hole and the first opening 202.

In the method according to the above embodiment, the pixel electrode 100 and the common electrode layer 40 are both formed on the array substrate, so that when a display device including the array substrate is bended, no misalignment will occur between the common electrode layer 40 and the pixel electrode 100, thus it can be ensured that a uniform electric field can be generated between the common electrode layer 40 and the pixel electrode 100 when the display device is in a bended state, so that the display device can operate in a stable stat.

Unless otherwise defined, any technical or scientific term used herein shall have the common meaning understood by a person skilled in the arts. Such words as "first" and "second" used in the present disclosure are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials, or characteristics may be combined in any embodiment or embodiments in an appropriate manner.

The above embodiments are for illustrative purposes only, but the present disclosure is not limited thereto. A person skilled in the art may make further modifications or substitutions without departing from the principle of the present disclosure, and these modifications or substitutions shall also fall within the scope of the present disclosure. Thus, a protect scope of the present disclosure shall be defined by the attached claims.

What is claimed is:

1. An array substrate, comprising:
   a base substrate;
   a Thin Film Transistor (TFT) array layer provided on the base substrate, wherein the TFT array layer comprises a plurality of driver transistors arranged in an array;
   a color resist layer provided on a side of the TFT array layer distal to the base substrate, wherein the color resist layer comprises a plurality of color resist patterns independent from each other, a first opening is formed between adjacent ones of the color resist patterns, and an orthogonal projection of the first opening onto the base substrate at least partially overlaps with an orthogonal projection of an output electrode in a respective one of the driver transistors onto the base substrate;
   pixel electrodes provided on a side of the color resist layer distal to the base substrate, wherein the pixel electrodes correspond to the driver transistors respectively, and the pixel electrode is connected to the output electrode in the corresponding driver transistor through the first opening;
   a planarization layer provided between the pixel electrodes and the color resist layer; and
   a common electrode layer provided between the planarization layer and the pixel electrodes, wherein the common electrode layer is provided with a second opening, and an orthogonal projection of the second opening onto the base substrate covers an entirety of the orthogonal projection of the first opening onto the base substrate.

2. The array substrate according to claim 1, wherein:
   the planarization layer is provided with a plurality of first via holes corresponding to the plurality of driver transistors respectively, an orthogonal projection of the first via hole onto the base substrate is located within the orthogonal projection of the first opening onto the base substrate, and the orthogonal projection of the first via hole on the base substrate at least partially overlaps with the orthogonal projection of the output electrode in the driver transistor corresponding to the first via hole onto the base substrate; and
   the pixel electrode is connected to the output electrode in the corresponding driver transistor through the corresponding first via hole and the corresponding first opening.

3. The array substrate according to claim 2, wherein an orthogonal projection of the planarization layer onto the base substrate covers an orthogonal projection of each of the color resist patterns onto the base substrate.

4. The array substrate according to claim 3, wherein a distance between a boundary of the orthogonal projection of the planarization layer onto the base substrate and a boundary of the orthogonal projection of the corresponding color resist pattern onto the base substrate is determined according to a dimensional precision of the array substrate to be manufactured.

5. The array substrate according to claim 3, wherein an orthogonal projection of the second opening onto the base substrate covers the orthogonal projection of the respective first via hole onto the base substrate, and the array substrate further comprises:
   a first passivation layer provided between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate;
   the pixel electrode is connected to the output electrode in the corresponding driver transistor through the corresponding second via hole, the corresponding second opening, the corresponding first via hole and the corresponding first opening.

6. The array substrate according to claim 2, wherein an orthogonal projection of the second opening onto the base substrate covers the orthogonal projection of the respective first via hole onto the base substrate, and the array substrate further comprises:
   a first passivation layer provided between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate;

the pixel electrode is connected to the output electrode in the corresponding driver transistor through the corresponding second via hole, the corresponding second opening, the corresponding first via hole and the corresponding first opening.

7. A display panel, comprising the array substrate according to claim 1, wherein the display panel further comprises:

an opposite substrate provided opposite to the array substrate, wherein a black matrix pattern is provided on the opposite substrate, an orthogonal projection of the black matrix pattern onto the base substrate of the array substrate covers an orthogonal projection of the first opening, which is formed between the adjacent color resist patterns in the array substrate, onto the base substrate; and a liquid crystal layer provided between the array substrate and the opposite substrate.

8. The display panel according to claim 7, wherein an orthogonal projection of the black matrix pattern onto the base substrate partially overlaps with an orthogonal projection of each of the color resist patterns, which are located at a periphery of the first opening, onto the base substrate.

9. The display panel according to claim 8, wherein a size of an overlapped part between the orthogonal projection of the black matrix pattern onto the base substrate and the orthogonal projection of each of the color resist patterns, which are located at the periphery of the first opening, onto the base substrate is determined according to a dimensional precision of the array substrate to be manufactured and a precision of alignment between the array substrate and the opposite substrate, and the color resist patterns.

10. A display device, comprising the display panel according to claim 7.

11. The display device according to claim 10, wherein an orthogonal projection of the black matrix pattern onto the base substrate partially overlaps with an orthogonal projection of each of the color resist patterns, which are located at a periphery of the first opening, onto the base substrate.

12. The display device according to claim 11, wherein a size of an overlapped part between the orthogonal projection of the black matrix pattern onto the base substrate and the orthogonal projection of each of the color resist patterns, which are located at the periphery of the first opening, onto the base substrate is determined according to a dimensional precision of the array substrate to be manufactured and a precision of alignment between the array substrate and the opposite substrate, and the color resist patterns.

13. The display panel according to claim 7, wherein the planarization layer is provided with a plurality of first via holes corresponding to the plurality of driver transistors respectively, an orthogonal projection of the first via hole onto the base substrate is located within the orthogonal projection of the first opening onto the base substrate, and the orthogonal projection of the first via hole on the base substrate at least partially overlaps with the orthogonal projection of the output electrode in the driver transistor corresponding to the first via hole onto the base substrate; and the pixel electrode is connected to the output electrode in the corresponding driver transistor through the corresponding first via hole and the corresponding first opening.

14. The display panel according to claim 13, wherein an orthogonal projection of the planarization layer onto the base substrate covers an orthogonal projection of each of the color resist patterns onto the base substrate.

15. The display panel according to claim 14, wherein a distance between a boundary of the orthogonal projection of the planarization layer onto the base substrate and a boundary of the orthogonal projection of the corresponding color resist pattern onto the base substrate is determined according to a dimensional precision of the array substrate to be manufactured.

16. The display panel according to claim 13, wherein an orthogonal projection of the second opening onto the base substrate covers the orthogonal projection of the respective first via hole onto the base substrate, and the array substrate further comprises:

a first passivation layer provided between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate;

the pixel electrode is connected to the output electrode in the corresponding driver transistor through the corresponding second via hole, the corresponding second opening, the corresponding first via hole and the corresponding first opening.

17. A method for manufacturing an array substrate, comprising:

providing a base substrate;

forming a TFT array layer on the base substrate, wherein the TFT array layer comprises a plurality of driver transistors arranged in an array;

forming a color resist layer on a side of the TFT array layer distal to the base substrate, wherein the color resist layer comprises a plurality of color resist patterns independent from each other, a first opening is formed between adjacent ones of the color resist patterns, and an orthogonal projection of the first opening onto the base substrate at least partially overlaps with an orthogonal projection of an output electrode in a respective one of the driver transistors onto the base substrate;

forming pixel electrodes on a side of the color resist layer distal to the base substrate, wherein the pixel electrodes correspond to the driver transistors respectively, and the pixel electrode is connected to the output electrode in the corresponding driver transistor through the first opening;

forming a planarization layer between the pixel electrodes and the color resist layer; and forming a common electrode layer between the planarization layer and the pixel electrodes, wherein the common electrode layer is provided with a second opening, and an orthogonal projection of the second opening onto the base substrate covers an entirety of the orthogonal projection of the first opening onto the base substrate.

18. The method for manufacturing the array substrate according to claim 17, wherein the planarization layer is provided with a plurality of first via holes corresponding to the plurality of driver transistors respectively, an orthogonal projection of the first via hole onto the base substrate is located within the orthogonal projection of the first opening onto the base substrate, and the orthogonal projection of the first via hole on the base substrate at least partially overlaps with the orthogonal projection of the output electrode in the driver transistor corresponding to the first via hole onto the base substrate; and the pixel electrode is connected to the output electrode in the corresponding driver transistor through the corresponding first via hole and the corresponding first opening.

19. The method for manufacturing the array substrate according to claim 18, wherein the forming the planarization layer between the pixel electrodes and the color resist layer comprises:

configuring that an orthogonal projection of the planarization layer onto the base substrate covers an orthogonal projection of each of the color resist patterns onto the base substrate.

20. The method for manufacturing the array substrate according to claim 18, wherein an orthogonal projection of the second opening onto the base substrate covers the orthogonal projection of the respective first via hole onto the base substrate, and the method further comprises:

forming a first passivation layer between the common electrode layer and the pixel electrodes, wherein the first passivation layer is provided with a plurality of second via holes corresponding to the plurality of driver transistors respectively, an orthogonal projection of the second via hole onto the base substrate is located within the orthogonal projection of the first via hole onto the base substrate, and the orthogonal projection of the second via hole onto the base substrate at least partially overlaps with the orthogonal projection of the output electrode in the driver transistor corresponding the second via hole onto the base substrate; the pixel electrode is connected to the output electrode in the corresponding driver transistor through the corresponding second via hole, the corresponding second opening, the corresponding first via hole and the corresponding first opening.

* * * * *